United States Patent
Brown

(10) Patent No.: US 9,963,340 B2
(45) Date of Patent: May 8, 2018

(54) PRESSURE SENSOR DIE OVER PRESSURE PROTECTION FOR HIGH OVER PRESSURE TO OPERATING SPAN RATIOS

(71) Applicant: Honeywell International Inc., Morris Plains, NJ (US)

(72) Inventor: Gregory C. Brown, Chanhassen, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days. days.

(21) Appl. No.: 14/958,372

(22) Filed: Dec. 3, 2015

(65) Prior Publication Data

US 2017/0158488 A1 Jun. 8, 2017

(51) Int. Cl.
| | | |
|---|---|---|
| *B81B 3/00* | (2006.01) | |
| *G01L 9/00* | (2006.01) | |
| *B81C 1/00* | (2006.01) | |

(52) U.S. Cl.
CPC ........ *B81B 3/0051* (2013.01); *B81C 1/00158* (2013.01); *G01L 9/0054* (2013.01);
(Continued)

(58) Field of Classification Search
CPC .......... B81B 3/0051; B81B 2201/0264; B81B 2203/0315; B81B 2203/0127;
(Continued)

(56) References Cited

U.S. PATENT DOCUMENTS

| | | |
|---|---|---|
| 4,072,058 A | 2/1978 | Whitehead, Jr. |
| 4,668,889 A | 5/1987 | Adams |
| | (Continued) | |

FOREIGN PATENT DOCUMENTS

| | | |
|---|---|---|
| DE | 102007003544 | 7/2008 |
| EP | 2058639 | 5/2009 |
| | (Continued) | |

OTHER PUBLICATIONS

Rongyan et al, "High Overload Pressure Sensor Construct With Polysilicon Nanofilm", Mar. 2015, pp. 1414-1420, vol. 15, No. 3, Publisher: IEEE, Published in: US.

(Continued)

*Primary Examiner* — Bo Fan
(74) *Attorney, Agent, or Firm* — Fogg & Powers LLC

(57) ABSTRACT

A pressure sensor die assembly comprises a base substrate having a first surface, a stop structure on the first surface, and a diaphragm structure coupled to the first surface. The diaphragm structure comprises a first side with a cavity section including a first cavity and a second cavity surrounding the first cavity; a pressure sensing diaphragm portion having a first thickness and defined by the first cavity; and an over pressure diaphragm portion having a second thickness and defined by the second cavity, the second thickness greater than the first thickness. When an over pressure is applied, at least some area of the pressure sensing diaphragm portion is deflected and supported by the stop structure. As over pressure is increased, the over pressure diaphragm portion deflects and engages with the first surface such that additional area of the pressure sensing diaphragm portion is deflected and supported by the stop structure.

17 Claims, 3 Drawing Sheets

(52) U.S. Cl.
CPC .......... B81B 2201/0264 (2013.01); B81B 2203/0127 (2013.01); B81B 2203/0315 (2013.01); B81C 2201/013 (2013.01); B81C 2201/0143 (2013.01); B81C 2203/0118 (2013.01)

(58) Field of Classification Search
CPC ............ G01L 9/0054; B81C 1/00158; B81C 2203/0118; B81C 2201/013; B81C 2201/0143
USPC ........................... 338/4; 73/720, 727
See application file for complete search history.

(56) References Cited

U.S. PATENT DOCUMENTS

| | | | |
|---|---|---|---|
| 4,670,733 A | | 6/1987 | Bell |
| 4,852,408 A | | 8/1989 | Sanders |
| 4,905,575 A | | 3/1990 | Knecht et al. |
| 5,070,735 A | | 12/1991 | Reichert et al. |
| 5,290,972 A | * | 3/1994 | Someya .............. G06F 3/03545 178/19.04 |
| 5,319,981 A | | 6/1994 | Mei et al. |
| 5,333,504 A | * | 8/1994 | Lutz .................... G01L 9/0042 338/4 |
| 6,030,851 A | | 2/2000 | Grandmont et al. |
| 8,350,345 B2 | * | 1/2013 | Vaganov .............. G06F 3/0338 257/415 |
| 2009/0120194 A1 | | 5/2009 | Rahn et al. |
| 2013/0068022 A1 | | 3/2013 | Jeung et al. |
| 2014/0175583 A1 | * | 6/2014 | Doyle .................... H01L 43/08 257/427 |
| 2014/0290375 A1 | | 10/2014 | Brida |
| 2015/0171316 A1 | * | 6/2015 | Park ....................... H01L 43/10 257/421 |
| 2015/0276526 A1 | | 10/2015 | Wade |
| 2017/0343438 A1 | | 11/2017 | Brown |

FOREIGN PATENT DOCUMENTS

| | | |
|---|---|---|
| JP | S59155971 | 9/1984 |
| JP | 62-145130 | 6/1987 |

OTHER PUBLICATIONS

European Patent Office, "Extended European Search Report from EP Application No. 16198301.0 dated Apr. 28, 2017", from Foreign Counterpart of U.S. Appl. No. 14/958,372, dated pp. 1-11, Published in: EP.

European Patent Office, "Extended European Search Report for EP Application No. 17168570.4", from Foreign Counterpart to U.S. Appl. No. 15/164,696, dated Oct. 19, 2017, pp. 1-16, Published in: EP.

US Patent and Trademark Office, "Restriction Requirement", U.S. Appl. No. 15/164,696, dated Jan. 8, 2018, pp. 1-5, Published in: US.

* cited by examiner

PRESSURE SENSOR DIE OVER PRESSURE PROTECTION FOR HIGH OVER PRESSURE TO OPERATING SPAN RATIOS

BACKGROUND

Silicon pressure sensors used to measure pressure in various systems and devices are often subjected to over pressures that exceed the full scale pressure rating of the sensor. Typical silicon sensors employing a deflectable on chip diaphragm to measure pressure are capable withstanding an over pressure of three to four times full scale pressure. If this level of over pressure rating is exceeded, the diaphragm will rupture, causing the pressure sensor to fail. Many applications require over pressure capability that can handle over pressures of ten times full scale or higher.

Conventional silicon pressure sensors are often protected from over pressure failure by external over pressure protection mechanisms. Such mechanisms add significant cost, complexity, and size to the pressure sensor function.

In other approaches for sensor protection, a deflection stop under the silicon pressure sensing diaphragm is employed such that the deflection is stopped after two times to three times full scale over pressure. While this is effective for over pressures less than about five times full scale, above that level, the over pressure loads the outer edges of the diaphragm even though the center is supported so that a shear failure occurs along the outer edge of the diaphragm, resulting in diaphragm failure.

SUMMARY

A pressure sensor die assembly comprises a base substrate having a first surface, a stop structure on the first surface of the base substrate, and a diaphragm structure coupled to the first surface of the base substrate. The diaphragm structure comprises a first side with a cavity section that includes a first cavity and a second cavity surrounding the first cavity; a pressure sensing diaphragm portion having a first thickness and defined by the first cavity, the pressure sensing diaphragm portion located over and spaced apart from the stop structure such that the stop structure protrudes into a portion of the first cavity; and an over pressure diaphragm portion having a second thickness and defined by the second cavity, the second thickness greater than the first thickness of the pressure sensing diaphragm portion. When an over pressure is applied to the diaphragm structure, at least some area of the pressure sensing diaphragm portion is deflected and supported by the stop structure. As the over pressure is increased, the over pressure diaphragm portion deflects and engages with the first surface of the base substrate such that additional area of the pressure sensing diaphragm portion is deflected and supported by the stop structure.

BRIEF DESCRIPTION OF THE DRAWINGS

Features of the present invention will become apparent to those skilled in the art from the following description with reference to the drawings. Understanding that the drawings depict only typical embodiments and are not therefore to be considered limiting in scope, the invention will be described with additional specificity and detail through the use of the accompanying drawings, in which.

DETAILED DESCRIPTION

Figure 1A:
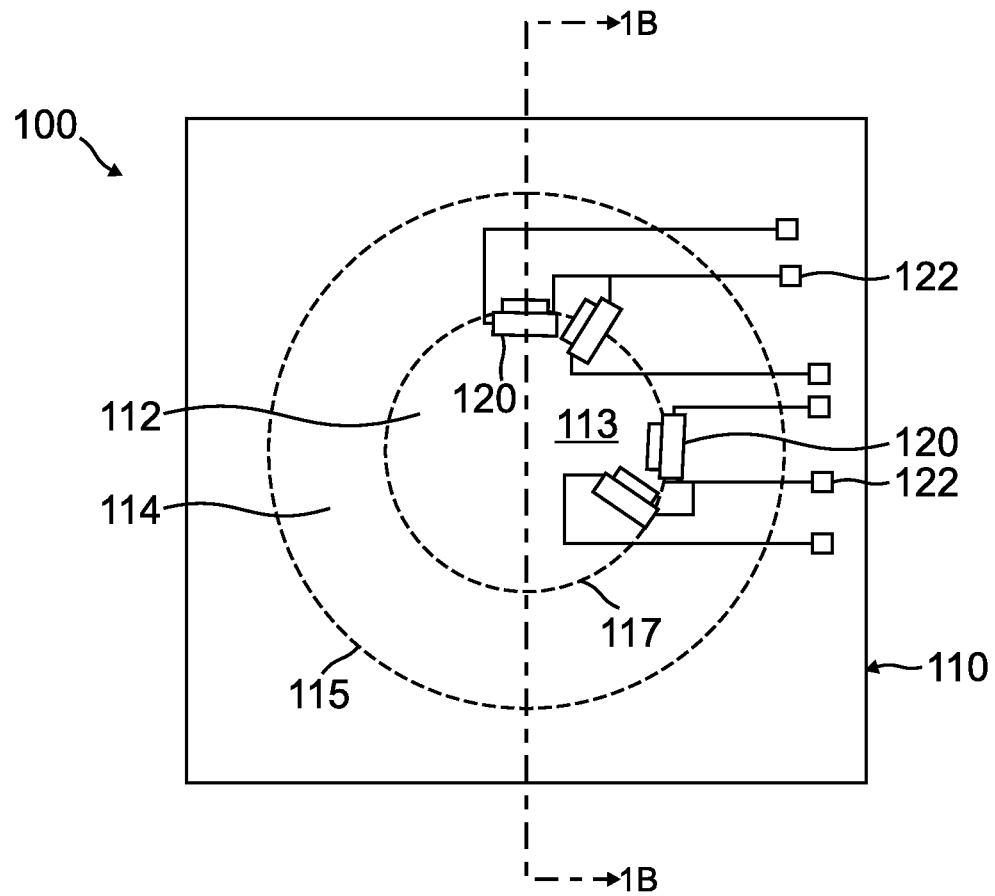
FIG. 1A is a top view of a pressure sensor die assembly with over pressure protection, according to one embodiment.

In the following detailed description, embodiments are described in sufficient detail to enable those skilled in the art to practice the invention. It is to be understood that other embodiments may be utilized without departing from the scope of the invention. The following detailed description is, therefore, not to be taken in a limiting sense.

A pressure sensor die assembly is provided with over pressure protection for high over pressure to operating span ratios. The over pressure protection for the pressure sensor die assembly improves the maximum burst pressure when used in pressure sensors that are employed in a variety of aerospace and downhole drilling applications.

The pressure sensor die assembly with over pressure protection generally includes a base substrate, an over pressure stop structure on the base substrate, and a diaphragm structure coupled to the base substrate over the stop structure.

The diaphragm structure comprises a pressure sensing diaphragm portion having a first thickness, and an over pressure diaphragm portion having a second thickness greater than the first thickness. The pressure sensing diaphragm portion is defined by a first cavity, and the over pressure diaphragm portion is defined by a second cavity that surrounds the first cavity. This results in the over pressure diaphragm portion surrounding and being stiffer than the pressure sensing diaphragm portion.

In a method of fabricating pressure sensor die assemblies with over pressure protection, a thin stop wafer with protruding structures is bonded to a base wafer, such as with a low temperature wafer to wafer bonding technique. Selected portions of the stop wafer are then removed, such as by etching or laser trimming, resulting in the protruding structures remaining coupled to the base wafer to form over pressure stop structures. A diaphragm wafer with sensing and over pressure cavities is then bonded to the base wafer over the stop structures, such as with low temperature wafer to wafer bonding. The bonded wafer structure is then divided to produce separate pressure sensor die assemblies, which can be implemented into a variety of pressure sensors.

During operation of a pressure sensor that includes the pressure sensor die assembly, as over pressure is increased above about two times to three times full scale, the over pressure diaphragm portion deflects such that a larger area of the pressure sensing diaphragm portion is supported by the stop structure. As this occurs, the pressure loaded area of the pressure sensing diaphragm portion is reduced, which reduces the shear loading in pounds per square inch (psi) along the outer perimeter of the pressure sensing diaphragm portion.

As the over pressure continues to increase, the pressure sensing diaphragm portion is fully supported by the stop structure, and for very high over pressures, the stresses become compressive as the pressure sensing diaphragm portion is deflected above its null position by the stop structure due to the continued deflection of the over pressure diaphragm portion. At approximately ten times full scale over pressure, the over pressure diaphragm portion contacts the base substrate and is also deflection limited. The over pressure protection allows the pressure sensor die assembly to be repeatedly exposed to over pressures of up to about ten times full scale, and even up to about twenty times full scale, without failure due to pressure shear stress over the area defined between the outer perimeters of the stop structure and the pressure sensing diaphragm portion.

Further details of various embodiments are described hereafter with reference to the drawings.

Figure 1B:
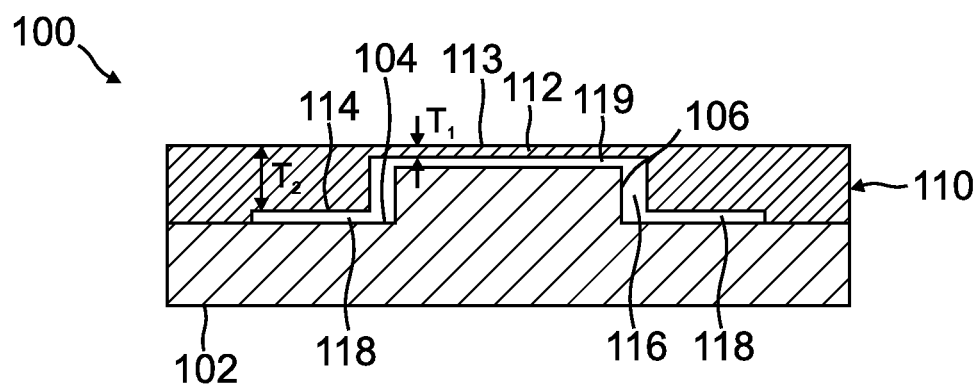
FIG. 1B is a cross-sectional side view of the pressure sensor die assembly of FIG. 1A.

FIGS. 1A and 1B illustrate a pressure sensor die assembly 100 that includes over pressure protection, according to one embodiment. The pressure sensor die assembly 100 generally comprises a base substrate 102, an over pressure stop structure 106 on base substrate 102, and a diaphragm structure 110 coupled to base substrate 102. The diaphragm structure 110 includes a pressure sensing diaphragm portion 112, and an over pressure diaphragm portion 114 concentric with and surrounding pressure sensing diaphragm portion 112. As such, over pressure diaphragm portion 114 has an outer circumference 115 that is greater than an outer circumference 117 of pressure sensing diaphragm portion 112. (FIG. 1A).

As shown in FIG. 1B, base substrate 102 has a first surface 104, with stop structure 106 protruding from first surface 104. The diaphragm structure 110 has a first side that is coupled to a portion of first surface 104. The first side of diaphragm structure 110 has a concentric cavity section that includes a first cavity 116 having a first depth, and a second cavity 118 having a second depth less than the first depth and surrounding first cavity 116. In one embodiment, first cavity 116 and second cavity 118 are concentric circular cavities.

In an alternative embodiment, first cavity 116 and second cavity 118 can be rectangular cavities, such that pressure sensing diaphragm portion 112 has a rectangular shape and is surrounded by over pressure diaphragm portion 114 also with a rectangular shape.

The pressure sensing diaphragm portion 112 has a pressure sensing surface 113 on a second side of diaphragm structure 110 opposite from the first side. The pressure sensing diaphragm portion 112 has a first thickness ($T_1$), and is defined by first cavity 116. The pressure sensing diaphragm portion 112 is located over and spaced apart from stop structure 106, with stop structure 106 protruding into a portion of first cavity 116. The pressure sensing diaphragm portion 112 is separated from stop structure 106 by a gap 119 in first cavity 116. The stop structure 106 protrudes into first cavity 116 such that gap 119 is maintained when no pressure is applied to pressure sensing diaphragm portion 112.

The over pressure diaphragm portion 114 has a second thickness ($T_2$) that is greater than the first thickness ($T_1$) of pressure sensing diaphragm portion 112, as depicted in FIG. 1B. The over pressure diaphragm portion 114 is defined by second cavity 118.

As shown in FIG. 1A, a plurality of piezoelectric bridge resistors 120 can be coupled to pressure sensing surface 113 of pressure sensing diaphragm portion 112. In one embodiment, each of bridge resistors 120 are electrically connected to a plurality of bond pads 122 on diaphragm structure 110, for providing electrical connections in a pressure sensor package.

The pressure sensor die assembly 100 can be formed using batch fabrication techniques with multiple wafers, which is described further hereafter. Each of base substrate 102, stop structure 106, and diaphragm structure 110 can comprise a material selected from silicon, germanium, sapphire, a metal, a ceramic such as silicon carbide, or the like.

During operation, when an over pressure is applied to diaphragm structure 110, at least some area of pressure sensing diaphragm portion 112 is deflected and supported by stop structure 106. As the over pressure is increased, over pressure diaphragm portion 114 deflects such that additional area of pressure sensing diaphragm portion 112 is deflected and supported by stop structure 106. An exemplary operation of a pressure sensor die assembly is described further hereafter.

FIGS. 2A-2E illustrate a method of fabricating pressure sensor die assemblies with over pressure protection, according to one embodiment. Although fabrication of two pressure sensor die assemblies is shown in FIGS. 2A-2D, it should be understood that additional pressure sensor die assemblies can be fabricated across the wafers used during the process by repeating the patterned structures shown.

Figure 2A:
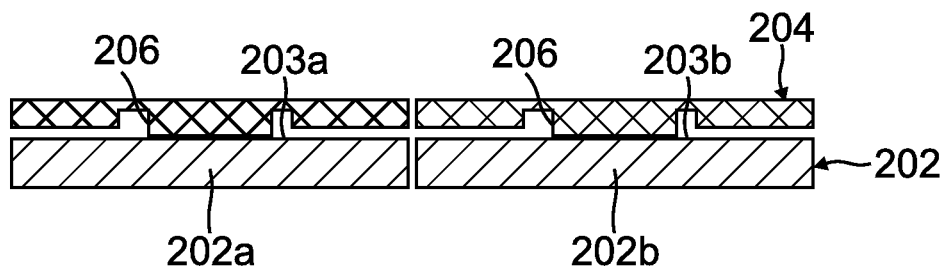
FIGS. 2A-2E are cross-sectional side views illustrating a method of fabricating pressure sensor die assemblies with over pressure protection, according to one embodiment.

As depicted in FIG. 2A, a base wafer 202 is provided, such as a silicon wafer, which is configured to form a plurality of base substrates 202a, 202b for the pressure sensor die assemblies. A stop wafer 204 is also provided that is patterned with a plurality of protruding structures 206 that will form the over pressure stop structures for each pressure sensor die assembly. The stop wafer 204 is attached to base wafer 202, such as by a low temperature wafer to wafer bonding technique, such that protruding structures 206 are respectively coupled to upper surfaces 203a, 203b of base substrates 202a, 202b.

Figure 2B:
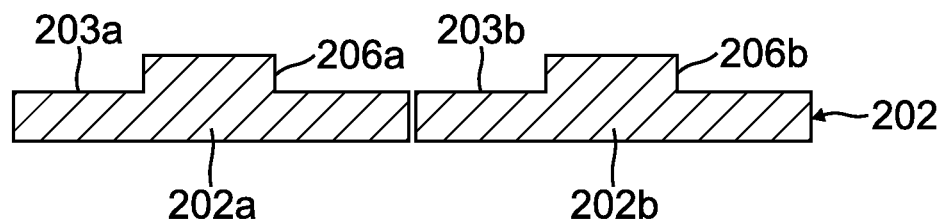

Next, selected portions of stop wafer 204 are removed, such as by etching or laser trimming, resulting in protruding structures 206 remaining coupled to upper surfaces 203a, 203b to form overpressure stop structures 206a, 206b, as shown in FIG. 2B.

Figure 2C:
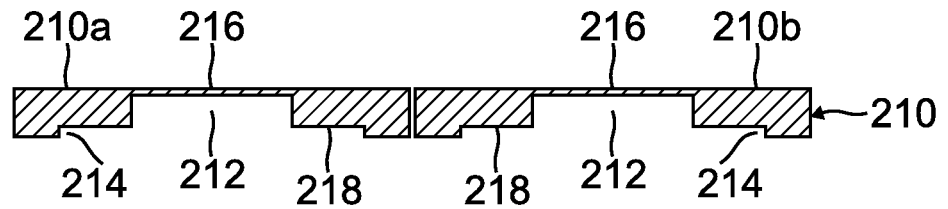

As illustrated in FIG. 2C, a patterned diaphragm wafer 210 is provided, which is configured to form a plurality of diaphragm structures 210a, 210b for the pressure sensor die assemblies. The diaphragm structures 210a, 210b are each patterned with a two step, cavity section that includes a first cavity 212 having a first depth, and a second cavity 214 having a second depth that is less than the first depth and surrounding first cavity 212. A precision etching process can be used to form cavities 212 and 214. The cavity section defines a pressure sensing diaphragm portion 216 and a surrounding over pressure diaphragm portion 218 for each of diaphragm structures 210a, 210b. The pressure sensing diaphragm portion 216 is defined by first cavity 212, and over pressure diaphragm portion 218 is defined by second cavity 214.

In one embodiment, first cavity 212 and second cavity 214 are formed as concentric circular cavities, resulting in pressure sensing diaphragm portion 216 having a circular shape and surrounded by over pressure diaphragm portion 218 also with a circular shape. In another embodiment, first cavity 212 and second cavity 214 are formed as rectangular cavities, resulting in pressure sensing diaphragm portion 216 having a rectangular shape and surrounded by over pressure diaphragm portion 218 also with a rectangular shape.

In one embodiment, first cavity 212 is partially formed first by applying a photoresist over a first side of diaphragm wafer 210 except in the area what will define pressure sensing diaphragm portion 216. The first cavity 212 is then etched until it is approximately at the desired full depth less the depth for second cavity 214. The second cavity 214 is then formed on diaphragm wafer 210 by applying photoresist everywhere on the first side except on the area that will define over pressure diaphragm portion 218. The wafer material is etched away in this area to form second cavity 214 at the desired depth, which defines over pressure diaphragm portion 218, and simultaneously, first cavity 212 is etched further to the desired full depth. A conventional etch stop strategy can be used to control the cavity etch depths.

Figure 2D:
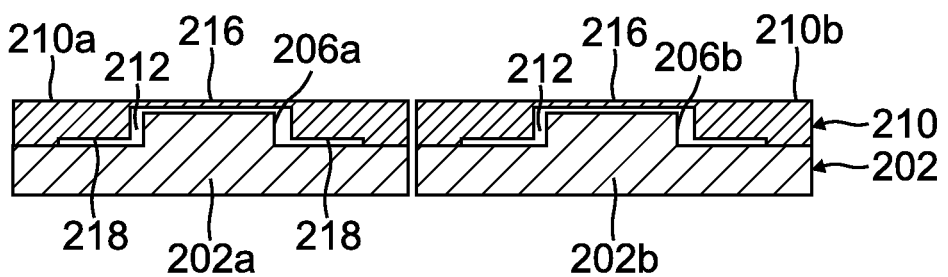

As depicted in FIG. 2D, the patterned diaphragm wafer 210 is then attached to base wafer 202 with stop structures 206a, 206b (FIG. 2B), such as by a low temperature wafer to wafer bonding technique. This bonding technique allows pressure sensing piezoelectric bridge resistors to be fabricated on diaphragm wafer 210 before the wafer to wafer bonding. In this configuration, stop structures 206a, 206b respectively protrude into first cavity 212 of each diaphragm structure 210a, 210b, such that a gap is maintained between the stop structures and pressure sensing diaphragm portion 216. In addition, second cavity 214 (FIG. 2C) of each diaphragm structure 210a, 210b provides a gap between the upper surfaces of base substrates 202a, 202b and over pressure diaphragm portion 218. These gaps are maintained until a pressure is applied to a pressure sensor that includes the fabricated pressure sensor die assembly.

The pressure sensing diaphragm portion 216 and over pressure diaphragm portion 218 can be sized using either standard deformable body equations for stress, strain and deflection, or by Finite Element Analysis. In one embodiment, over pressure diaphragm portion 218 is formed and sized to have a stiffness that is greater than a stiffness of pressure sensing diaphragm portion 216.

Figure 2E:
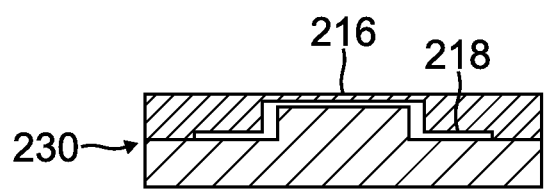

The bonded wafers 202 and 210 (FIG. 2D) are then divided to produce separate pressure sensor die assemblies, such as a pressure sensor die assembly 230 shown in FIG. 2E, which includes over pressure protection for pressure sensing diaphragm portion 216 provided by over pressure diaphragm portion 218. The pressure sensor die assembly 230 can then be implemented into a variety of pressure sensor devices.

Figure 3A:
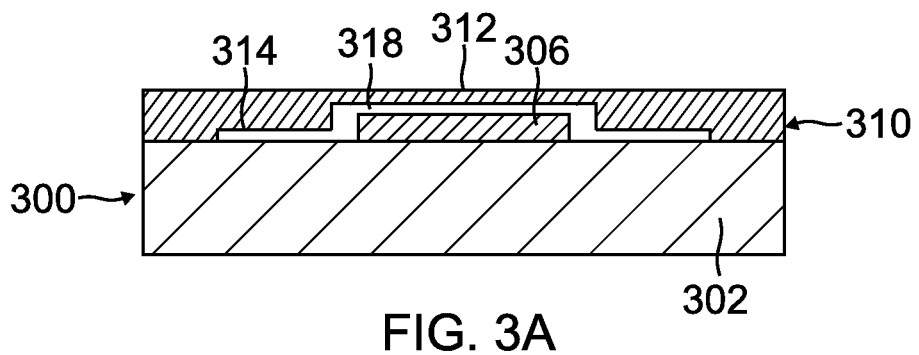
FIGS. 3A-3C are cross-sectional side views illustrating operation of a pressure sensor die assembly with over pressure protection, according to one embodiment, which is subjected to increasing over pressure.
Figure 3B:
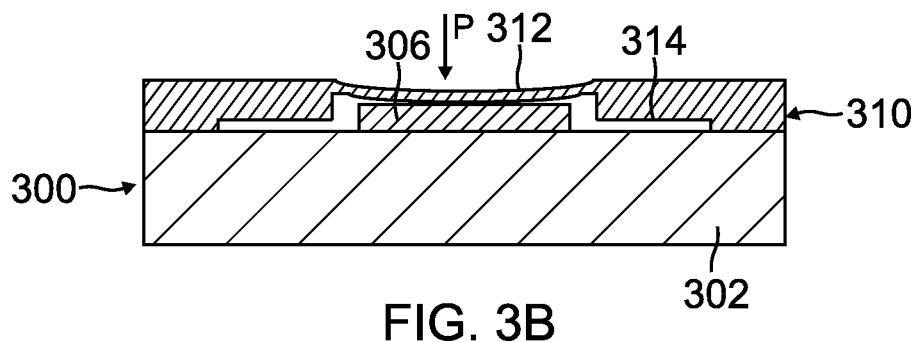
Figure 3C:
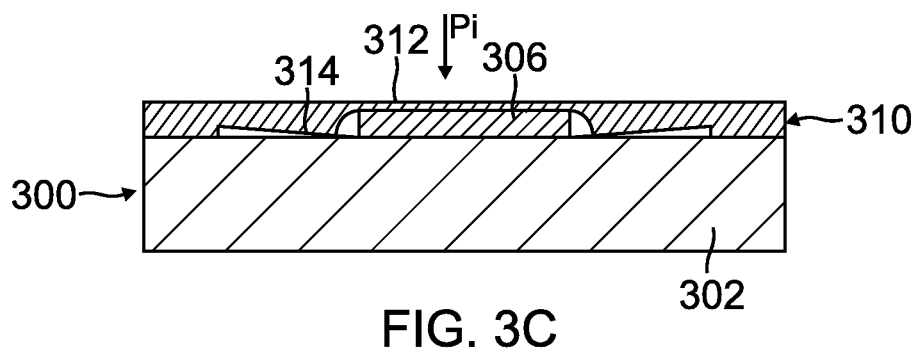

FIGS. 3A-3C illustrate the operation of a pressure sensor die assembly 300 with over pressure protection according to one embodiment, which is subjected to increasing over pressure. The pressure sensor die assembly 300 includes essentially the same components as described previously for pressure sensor die assembly 100, including a base substrate 302, an over pressure stop structure 306 on base substrate 302, and a diaphragm structure 310 coupled to base substrate 302. The diaphragm structure 310 includes a pressure sensing diaphragm portion 312, and an over pressure diaphragm portion 314 that surrounds pressure sensing diaphragm portion 312. In one embodiment, pressure sensing diaphragm portion 312 and over pressure diaphragm portion 314 have concentric circular shapes. In another embodiment, pressure sensing diaphragm portion 312 and over pressure diaphragm portion 314 have rectangular shapes.

FIG. 3A illustrates the configuration of pressure sensor die assembly 300 with no pressure applied to pressure sensing diaphragm portion 312. In this configuration, a gap 318 is maintained between stop structure 306 and pressure sensing diaphragm portion 312.

FIG. 3B depicts the configuration of pressure sensor die assembly 300 with an over pressure (P) applied to pressure sensing diaphragm portion 312. For example, an over pressure of about three times full scale results in the configuration shown in FIG. 3B. In this configuration, pressure sensing diaphragm portion 312 is deflected such that a part of the lower surface area of pressure sensing diaphragm portion 312 is supported by stop structure 306, while over pressure diaphragm portion 314 has not yet engaged with base substrate 302.

FIG. 3C illustrates the configuration of pressure sensor die assembly 300 with increasing over pressure ($P_t$) applied to pressure sensing diaphragm portion 312. For example, an over pressure of greater than about six times full scale results in the configuration shown in FIG. 3C. In this configuration, over pressure diaphragm portion 314 deflects such that additional lower surface area of pressure sensing diaphragm portion 312 is supported by stop structure 306. As the over pressure continues to increase, over pressure diaphragm portion 314 becomes fulling engaged and stopped by the upper surface of base substrate 302.

Example Embodiments

Example 1 includes a pressure sensor die assembly comprising a base substrate having a first surface; a stop structure on the first surface of the base substrate; and a diaphragm structure coupled to the first surface of the base substrate. The diaphragm structure comprises a first side with a cavity section that includes a first cavity and a second cavity surrounding the first cavity; a pressure sensing diaphragm portion having a first thickness and defined by the first cavity, the pressure sensing diaphragm portion located over and spaced apart from the stop structure such that the stop structure protrudes into a portion of the first cavity; and an over pressure diaphragm portion having a second thickness and defined by the second cavity, the second thickness greater than the first thickness of the pressure sensing diaphragm portion. When an over pressure is applied to the diaphragm structure, at least some area of the pressure sensing diaphragm portion is deflected and supported by the stop structure, and as the over pressure is increased, the over pressure diaphragm portion deflects and engages with the first surface of the base substrate such that additional area of the pressure sensing diaphragm portion is deflected and supported by the stop structure.

Example 2 includes the pressure sensor die assembly of Example 1, wherein the base substrate, the stop structure, and the diaphragm structure each include a material comprising silicon, germanium, sapphire, a metal, or a ceramic.

Example 3 includes the pressure sensor die assembly of any of Examples 1-2, wherein the over pressure diaphragm portion has a stiffness that is greater than a stiffness of the pressure sensing diaphragm portion.

Example 4 includes the pressure sensor die assembly of any of Examples 1-3, wherein the first cavity has a first depth, and the second cavity has second depth that is less than the first depth.

Example 5 includes the pressure sensor die assembly of any of Examples 1-4, wherein the first cavity and the second cavity are concentric circular cavities, such that the over pressure diaphragm portion has an outer circumference that is greater than an outer circumference of the pressure sensing diaphragm portion.

Example 6 includes the pressure sensor die assembly of any of Examples 1-4, wherein the first cavity and the second cavity are rectangular cavities.

Example 7 includes the pressure sensor die assembly of any of Examples 1-6, wherein the stop structure protrudes into a portion of the first cavity such that a gap is maintained between the stop structure and the pressure sensing diaphragm portion when no pressure is applied to the diaphragm structure.

Example 8 includes the pressure sensor die assembly of any of Examples 1-7, wherein the pressure sensing diaphragm portion has a pressure sensing surface on a second side of the diaphragm structure opposite from the first side.

Example 9 includes the pressure sensor die assembly of Example 8, further comprising a plurality of piezoelectric bridge resistors coupled to the pressure sensing surface, the piezoelectric bridge resistors electrically connected to a plurality of bond pads on the diaphragm structure.

Example 10 includes the pressure sensor die assembly of any of Examples 1-9, wherein the pressure sensor die assembly is configured for exposure to an over pressure of up to about twenty times full scale.

Example 11 includes a method of fabricating one or more pressure sensor die assemblies with over pressure protection, the method comprising providing a base wafer configured with one or more base substrates; patterning a stop wafer with one or more protruding structures; attaching the stop wafer to the base wafer such that the one or more protruding structures are respectively coupled to the one or more base substrates; removing selected portions of the stop wafer attached to the base wafer such that the one or more protruding structures remain coupled to the one or more base substrates to form one or more stop structures; patterning a diaphragm wafer to form one or more diaphragm structures each with a two step cavity section that includes a first cavity having a first depth, and a second cavity having a second depth less than the first depth and surrounding the first cavity, wherein the one or more diaphragm structures each include a pressure sensing diaphragm portion defined by the first cavity, and an over pressure diaphragm portion that surrounds the pressure sensing diaphragm portion and is defined by the second cavity; and attaching the patterned diaphragm wafer to the base wafer such that the one or more stop structures respectively protrude into the first cavity of the one or more diaphragm structures, wherein a gap is maintained between the one or more stop structures and the pressure sensing diaphragm portion until a pressure is applied to the diaphragm structure.

Example 12 includes the method of Example 11, wherein the stop wafer is attached to the base wafer by wafer to wafer bonding.

Example 13 includes the method of any of Examples 11-12, wherein the selected portions of the stop wafer are removed by an etching process or by laser trimming.

Example 14 includes the method of any of Examples 11-13, wherein the diaphragm wafer is patterned by an etching process.

Example 15 includes the method of any of Examples 11-14, wherein the diaphragm wafer is attached to the base wafer by wafer to wafer bonding.

Example 16 includes the method of any of Examples 11-15, further comprising forming a plurality of piezoelectric bridge resistors on the diaphragm wafer prior to attaching the diaphragm wafer to the base wafer.

Example 17 includes the method of any of Examples 11-16, wherein the base wafer, the stop wafer, and the diaphragm wafer each include a material comprising silicon, germanium, sapphire, a metal, or a ceramic.

Example 18 includes the method of any of Examples 11-17, wherein the over pressure diaphragm portion is formed to have a stiffness that is greater than a stiffness of the pressure sensing diaphragm portion.

Example 19 includes the method of any of Examples 11-18, wherein the first cavity and the second cavity are formed as concentric circular cavities, such that the over pressure diaphragm portion has an outer circumference that is greater than an outer circumference of the pressure sensing diaphragm portion.

Example 20 includes the method of any of Examples 11-18, wherein the first cavity and the second cavity are formed as rectangular cavities.

The present invention may be embodied in other specific forms without departing from its essential characteristics. The described embodiments are to be considered in all respects only as illustrative and not restrictive. The scope of the invention is therefore indicated by the appended claims rather than by the foregoing description. All changes that come within the meaning and range of equivalency of the claims are to be embraced within their scope.

What is claimed is:

1. A pressure sensor die assembly, comprising:
   a base substrate having a first surface;
   a stop structure on the first surface of the base substrate; and
   a diaphragm structure coupled to the first surface of the base substrate, the diaphragm structure comprising:
      a first side with a stepped cavity section that includes a first cavity and a second cavity surrounding the first cavity, wherein the first cavity is defined by a first horizontal surface having a first elevation, and the second cavity is defined by a second horizontal surface having a second elevation that is different than the first elevation;
      a pressure sensing diaphragm portion comprising the first horizontal surface and having a first thickness, the pressure sensing diaphragm portion located over and spaced apart from the stop structure, wherein the stop structure protrudes into the first cavity so as to vertically overlap with the first cavity; and
      an over pressure diaphragm portion comprising the second horizontal surface and having a second thickness, the second thickness greater than the first thickness of the pressure sensing diaphragm portion;
   wherein when an over pressure is applied to the diaphragm structure, at least some area of the pressure sensing diaphragm portion is deflected and supported by the stop structure, and as the over pressure is increased, the over pressure diaphragm portion deflects and engages with the first surface of the base substrate such that additional area of the pressure sensing diaphragm portion is deflected and supported by the stop structure.

2. The pressure sensor die assembly of claim 1, wherein the base substrate, the stop structure, and the diaphragm structure each include a material comprising silicon, germanium, sapphire, a metal, or a ceramic.

3. The pressure sensor die assembly of claim 1, wherein the over pressure diaphragm portion has a stiffness that is greater than a stiffness of the pressure sensing diaphragm portion.

4. The pressure sensor die assembly of claim 1, wherein the first cavity has a first depth, and the second cavity has second depth that is less than the first depth.

5. The pressure sensor die assembly of claim 4, wherein the first cavity and the second cavity are concentric circular cavities, such that the over pressure diaphragm portion has an outer circumference that is greater than an outer circumference of the pressure sensing diaphragm portion.

6. The pressure sensor die assembly of claim 4, wherein the first cavity and the second cavity are rectangular cavities.

7. The pressure sensor die assembly of claim 1, wherein the stop structure protrudes into a portion of the first cavity such that a gap is maintained between the stop structure and the pressure sensing diaphragm portion when no pressure is applied to the diaphragm structure.

8. The pressure sensor die assembly of claim 1, wherein the pressure sensing diaphragm portion has a pressure sensing surface on a second side of the diaphragm structure opposite from the first side.

9. The pressure sensor die assembly of claim 8, further comprising a plurality of piezoelectric bridge resistors coupled to the pressure sensing surface, the piezoelectric bridge resistors electrically connected to a plurality of bond pads on the diaphragm structure.

10. The pressure sensor die assembly of claim 1, wherein the pressure sensor die assembly is configured for exposure to an over pressure of up to about twenty times full scale.

11. A pressure sensor die assembly, comprising:
a base substrate having a first surface;
a stop structure on the first surface of the base substrate; and
a diaphragm structure coupled to the first surface of the base substrate, the diaphragm structure comprising:
a first side with a cavity section that includes a first cavity and a second cavity surrounding the first cavity;
a pressure sensing diaphragm portion having a first thickness that overlaps exactly with the first cavity such that the first thickness is vertically greater in dimension than the first cavity, the pressure sensing diaphragm portion located over and spaced apart from the stop structure, wherein the stop structure protrudes into the first cavity so as to vertically overlap with the first cavity; and
an over pressure diaphragm portion having a second thickness and defined by the second cavity, the second thickness greater than the first thickness of the pressure sensing diaphragm portion.

12. The pressure sensor die assembly of claim 11, wherein the over pressure diaphragm portion has a stiffness that is greater than a stiffness of the pressure sensing diaphragm portion.

13. The pressure sensor die assembly of claim 11, wherein the first cavity has a first depth, and the second cavity has second depth that is less than the first depth.

14. The pressure sensor die assembly of claim 13, wherein the first cavity and the second cavity are concentric circular cavities, such that the over pressure diaphragm portion has an outer circumference that is greater than an outer circumference of the pressure sensing diaphragm portion.

15. The pressure sensor die assembly of claim 11, wherein the stop structure protrudes into a portion of the first cavity such that a gap is maintained between the stop structure and the pressure sensing diaphragm portion when no pressure is applied to the diaphragm structure.

16. The pressure sensor die assembly of claim 11, wherein the pressure sensing diaphragm portion has a pressure sensing surface on a second side of the diaphragm structure opposite from the first side.

17. The pressure sensor die assembly of claim 16, further comprising a plurality of piezoelectric bridge resistors coupled to the pressure sensing surface, the piezoelectric bridge resistors electrically connected to a plurality of bond pads on the diaphragm structure.

* * * * *